United States Patent
Jiang et al.

(10) Patent No.: US 8,218,712 B1
(45) Date of Patent: Jul. 10, 2012

(54) METHOD AND APPARATUS FOR DIVIDING CLOCK FREQUENCIES

(75) Inventors: Xuewen Jiang, Chandler, AZ (US); Adebabay M. Bekele, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 246 days.

(21) Appl. No.: 12/796,414

(22) Filed: Jun. 8, 2010

(51) Int. Cl.
*H03K 23/00* (2006.01)
(52) U.S. Cl. ............ 377/47; 327/115; 327/117; 377/52
(58) Field of Classification Search .................. 327/115, 327/117, 118; 377/47, 48, 52
See application file for complete search history.

(56) References Cited

U.S. PATENT DOCUMENTS

| | | | | |
|---|---|---|---|---|
| 4,184,068 A | * | 1/1980 | Washburn | 377/44 |
| 4,357,527 A | * | 11/1982 | Kojima | 377/48 |
| 4,390,960 A | * | 6/1983 | Yamashita et al. | 708/103 |
| 4,468,797 A | * | 8/1984 | Shin | 377/52 |
| 4,943,981 A | * | 7/1990 | Cowley | 377/47 |
| 5,084,907 A | * | 1/1992 | Maemura | 377/28 |
| 5,086,441 A | * | 2/1992 | Maemura et al. | 377/107 |
| 5,111,160 A | * | 5/1992 | Hershberger | 331/1 A |
| 6,411,669 B1 | * | 6/2002 | Kim | 377/48 |
| 6,725,245 B2 | * | 4/2004 | Bucska | 708/103 |
| 6,952,121 B1 | * | 10/2005 | Vu | 327/115 |
| 2008/0224735 A1 | * | 9/2008 | Do et al. | 327/106 |

OTHER PUBLICATIONS

Alioto, Massimo et al., "Design of High-Speed Power-Efficient MOS Current-Mode Logic Frequency Dividers," *IEEE Transactions on Ciruits and Systems—II: Express Briefs*, Nov. 2006, pp. 1165-1169, vol. 53, No. 11, IEEE, Piscataway, New Jersey, USA.

Larsson, Patrik, "High-Speed Architecture for a Programmable Frequency Divider and a Dual-Modulus Prescaler," *IEEE Journal of Solid-State Circuits*, May 1996, pp. 744-748, vol. 31, No. 5, IEEE, Piscataway, New Jersey, USA.

* cited by examiner

*Primary Examiner* — Lincoln Donovan
*Assistant Examiner* — William Hernandez
(74) *Attorney, Agent, or Firm* — Kin-Wah Tong; Lois D. Cartier

(57) ABSTRACT

A method and apparatus for dividing clock frequencies are disclosed. For example, a circuit according to one embodiment of includes a high-speed divider and a plurality of programmable dividers cascading with the high-speed divider, wherein the plurality of programmable dividers are of a lower speed than the high-speed divider.

18 Claims, 7 Drawing Sheets

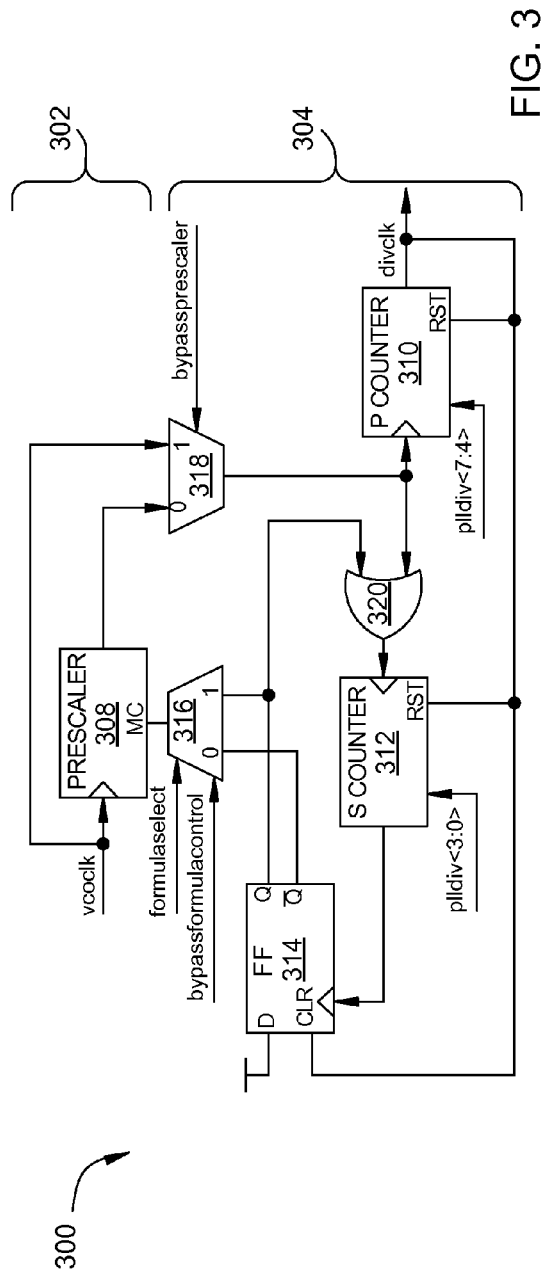
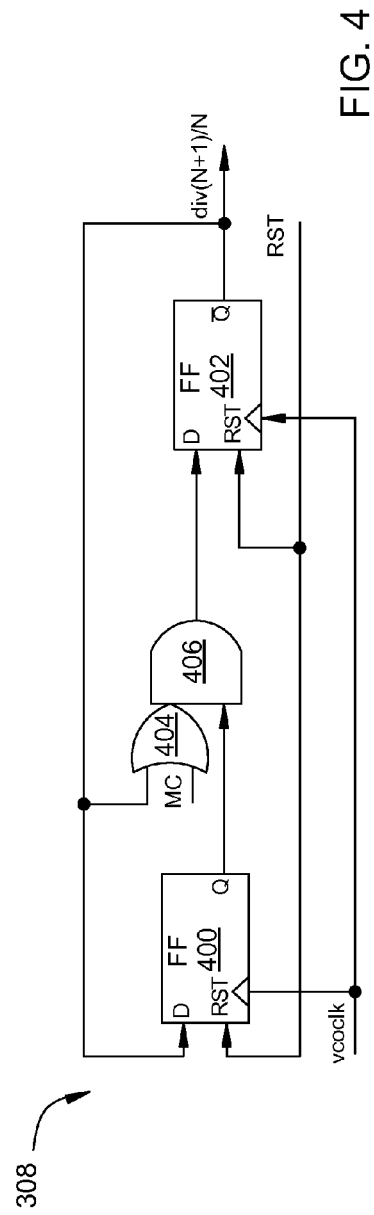
FIG. 3
FIG. 4

| Formsel | %P | %S | div ratio |
|---|---|---|---|
| 0 | 0 | 0 | 8 |
| 1 | 1 | 1 | 9 |
| 1 | 1 | 0 | 10 |
| 0 | 1 | 0 | 11 |
| 0 | 1 | 1 | 12 |
| 1 | 2 | 1 | 13 |
| 1 | 2 | 0 | 14 |
| 0 | 2 | 1 | 15 |
| 0 | 2 | 2 | 16 |
| 1 | 3 | 1 | 17 |
| 0 | 3 | 1 | 18 |
| 0 | 3 | 2 | 19 |
| 0 | 3 | 3 | 20 |
| ... | ... | ... | ... |

METHOD AND APPARATUS FOR DIVIDING CLOCK FREQUENCIES

FIELD OF THE INVENTION

This invention relates generally to integrated circuits and relates more particularly to clocking for integrated circuit applications.

BACKGROUND

Frequency dividers are often used in integrated circuits to divide the frequency of an incoming clock signal down to a required frequency. FIG. 1, for example, is a schematic diagram illustrating a conventional divider 100. As illustrated, the divider 100 comprises a high speed divider 102 and a low speed divider 106. The high speed divider 102 divides the frequency of an incoming clock signal by a fixed amount N. The divided clock signal is then passed to the low speed divider 106 for further division by a programmable amount P. A final divided-down clock (divided by N*P) is then output by the low speed divider 106.

The divider ratios that are achievable using the divider 100 are limited by the capabilities of the high speed divider 102. Specifically, achievable divider ratios comprise the high speed divider ratio (which is fixed at N) multiplied by the low speed divider ratio (which is programmable up to P). Thus, only divider ratios that are multiples of N (e.g., 1N, 2N, . . . , PN) are achievable; divider ratios that are not multiples of N (which includes most prime numbers, among others) are not supported. Thus, although the divider 100 affords some programmability in divide ratio, this programmability is limited.

In addition, increased programmability in divide ratio often limits high-speed design robustness. For example, programmability tends to cause additional timing delays during control, which consumes the overall timing budget and sets a high-speed design limit. Thus, conventional dividers tend to be either highly programmable or highly high-speed robust, but not both.

SUMMARY

In one embodiment, a method and apparatus for dividing clock frequencies are disclosed. For example, a circuit according to one embodiment includes a high-speed divider and a plurality of programmable dividers cascading with the high-speed divider, wherein the plurality of programmable dividers is of a lower speed than the high-speed divider.

In various embodiments, the plurality of programmable dividers can control a modulus of the high-speed divider; the high-speed divider can be a dual-modulus prescaler; the high-speed divider can further include a first input coupled to a source of a clock signal, a second input coupled to a first multiplexer, and an output coupled to a second multiplexer; the plurality of programmable dividers can further include a primary programmable counter and a secondary programmable counter; the primary programmable counter can divide an incoming signal by a first number that is larger than a second number by which the secondary programmable counter divides the incoming signal; the primary programmable counter can further include a first input coupled to an output of the second multiplexer and a first output coupled to a first input of the secondary programmable counter; the secondary programmable counter can further include a first input coupled to an output of an OR gate; the OR gate can further include a first input coupled to the output of the secondary multiplexer and a second input coupled to a first output of a flip flop; the flip flop can further include a first input coupled to a first output of the primary programmable counter, a second input coupled to a first output of the secondary programmable counter, a first output coupled to a first input of the first multiplexer, and a second output coupled to a second input of the first multiplexer; and the flip flop can be an asynchronous-reset D-type flip flop.

According to another embodiment, a method of dividing a frequency of a clock signal is provided. The method includes: dividing the frequency in a high-speed divider to produce a first divided frequency and dividing the first divided frequency in a plurality of programmable dividers cascading with the high-speed divider, where the plurality of programmable dividers is of a lower speed than the high-speed divider.

According to another embodiment, a method of dividing a frequency of a clock signal is provided. The method includes: dividing the frequency in a high-speed divider in accordance with a first divide-by mode, wherein the dividing in accordance with the first divide-by mode results in a new signal being produced by the high speed divider every n cycles of the clock signal, counting a number of times that the new signal is received in a primary programmable divider, counting a number of times that the new signal is received in a secondary programmable divider, and dividing the frequency in the high-speed divider in accordance with a second divide-by mode when the secondary programmable divider overflows, wherein the dividing in accordance with the second divide-by mode results in the new signal being produced by the high speed divider every m cycles of the clock signal, and wherein m is a different number than n.

In various embodiments, the method can further include stopping the counting in the secondary programmable divider when the dividing in accordance with the second divide-by mode is started and continuing the counting in the primary programmable divider when the dividing in accordance with the second divide-by mode is started; outputting a divided frequency by the primary programmable divider when the primary programmable divider overflows; the primary programmable divider may overflow a number of cycles of the clock after the secondary programmable divider overflows; n can be greater than m; m can be greater than n; and the primary programmable divider and the secondary programmable divider can operate at a slower speed than the high-speed divider.

Also provided is a non-transitory computer-readable storage medium having stored thereon a plurality of instructions, the plurality of instructions including instructions which, when executed by a processor, cause the processor to perform steps of a method for dividing a frequency of a clock signal. The method includes: dividing the frequency in a high-speed divider in accordance with a first divide-by mode, wherein the dividing in accordance with the first divide-by mode results in a new signal being produced by the high speed divider every n cycles of the clock signal, counting a number of times that the new signal is received in a primary programmable divider, counting a number of times that the new signal is received in a secondary programmable divider, and dividing the frequency in the high-speed divider in accordance with a second divide-by mode when the secondary programmable divider overflows, wherein the dividing in accordance with the second divide-by mode results in the new signal being produced by the high speed divider every m cycles of the clock signal, and wherein m is a different number than n.

BRIEF DESCRIPTION OF THE DRAWINGS

Accompanying drawings show exemplary embodiments in accordance with one or more aspects of the invention; however, the accompanying drawings should not be taken to limit the invention to the embodiments shown, but are for explanation and understanding only.

FIG. 3 is a schematic diagram illustrating one embodiment of a divider;

FIG. 4 is a schematic diagram illustrating the prescaler of FIG. 3 in more detail;

FIG. 7 is a look up table illustrating the divide ratios for different permutations of the values of the formulaselect signal, the primary programmable counter, and the secondary programmable counter.

DETAILED DESCRIPTION

The described embodiments employ a divider having cascading high speed and low speed stages. The high speed stage exhibits more high speed robustness, while the low speed stage exhibits more programmability in timing. In this manner, the divider final output duty cycle is better than that of a simple counter-based programmable divider, the speed limit is at least as high as a simple prescaler divider.

The described embodiments thus address the problem of continuous division, where an input clock signal may be divided by an integer k (k=n, n+1, . . . , m). In one embodiment, a bypass mode enables the use of only the high speed stage and a portion of the low speed stage, which limits continuous division but allows for power savings.

The described embodiments achieve continuous division by dividing the counting region into two parts: a first part in which the high speed stage operates in a first mode of operation and a second part in which the high speed stage operates in a second mode of operation. A splitting point between these modes of operation is decided by a secondary running programmable divider that starts at the same time as a primary programmable divider, but stops at some point before the primary programmable divider stops. This allows for more divider ratios to be available between NP and (N+1)P, where N and N+1 are the two modes of operation of the high speed stage.

During the time that the secondary programmable divider is running/counting, if the high speed stage is in mode N, the final divider ratio programmable step is N. Similarly, during the time that the secondary programmable divider is running/counting, if the high speed stage is in mode N+1, the final divider ratio programmable step is N+1. If these two cases (in which the final divider programmability steps can be N or N+1) are combined, two different formulas for the final divider ratio are produced. These two formulas provide finer complementary coverage for incremental unit steps between NP and (N+1)P. Although there is some redundancy for the two formulas, the additional glue logic overhead that is used to support them is minimal. In this case, a unit step programmable divider ratio can be achieved (e.g., 8, 9, 10, 11, 12, 13, 14, 15, . . . ) with speed and duty cycle performance that is comparable to conventional dividers such as the divider 100 illustrated in FIG. 1 (e.g., 9, 12, 15, . . . ).

Figure 2:
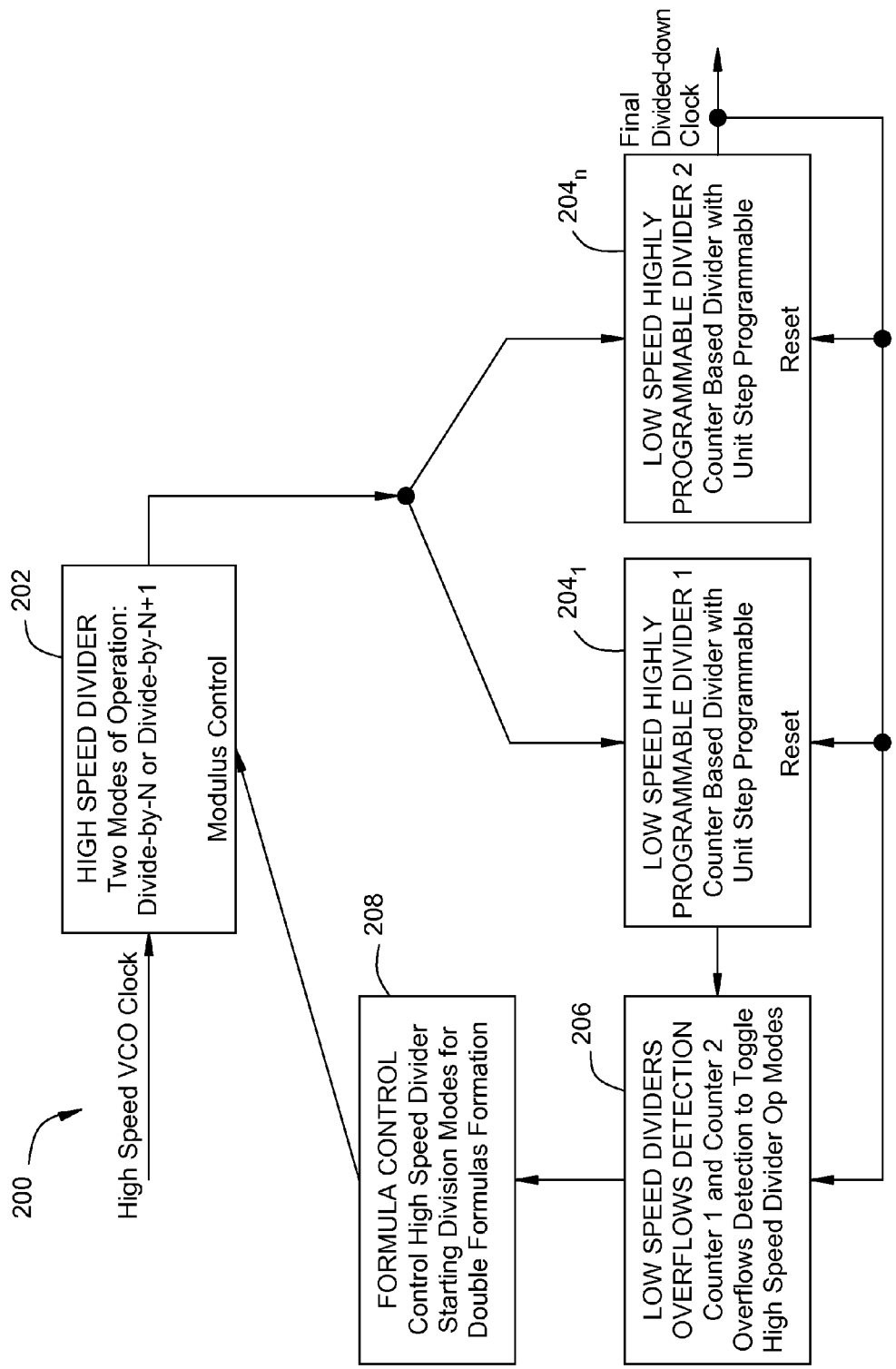
FIG. 2 is a schematic diagram illustrating one embodiment of a divider.

FIG. 2 is a schematic diagram illustrating one embodiment of a divider 200. In particular, FIG. 2 presents a high-level view of the divider 200. The divider 200 may be integrated into the logic fabric of an integrated circuit such as, for example, a programmable logic device (PLD) or an application-specific integrated circuit (ASIC). A PLD, in turn, may comprise a field programmable gate array (FPGA), or the like.

As illustrated, the divider 200 comprises a high speed divider 202 and a plurality of programmable low speed dividers $204_1$-$204_n$ (hereinafter collectively referred to as "low speed dividers 204"). In addition, the divider 200 comprises an overflow detection block 206 and a formula control block 208.

The low speed dividers include a primary low speed divider $204_n$ and a secondary low speed divider $204_1$ that runs in parallel with the primary low speed divider $204_n$. The secondary low speed divider $204_1$ splits the region of the primary low speed divider's counting into two parts (where/when the split occurs is programmed by the secondary low speed divider $204_1$). As such, different lengths of the primary low speed divider's region will be in divide-by-N or divide-by-(N+1) mode. This difference is achieved by toggling the high speed divider's operation mode when either of the low speed dividers 204 overflows (e.g., as detected by the overflow detection block 206).

The formula control block 208 sets the starting mode of the high speed divider 202, which in turn sets the programmability step sizes in the overall final divider ratios. The overhead in this design includes one parallel programmable low speed divider (i.e., the secondary low speed divider $204_1$) and simple logic for overflow detection and formula select (i.e., overflow detection block 206 and formula control block 208). The result is speed and duty cycle performance that is comparable to conventional dividers, but with dramatically improved divider ratio programmability, as discussed above.

In operation, the low speed dividers 204 are highly programmable. When an overflow happens in one of the low speed dividers 204, the overflow is detected by the overflow detection block 206, which will the toggle the high speed divider's frequency division mode from modulus one to modulus two. If the divider ratio of the secondary low speed divider $204_1$ is swept from decimal value one to the full divider ratio of the primary low speed divider $204_n$, the overall final divider ratio will be spread between NP and (N+1)P, with some offset being added to account for counters overflow and reset consuming some clock cycles.

Figure 1:
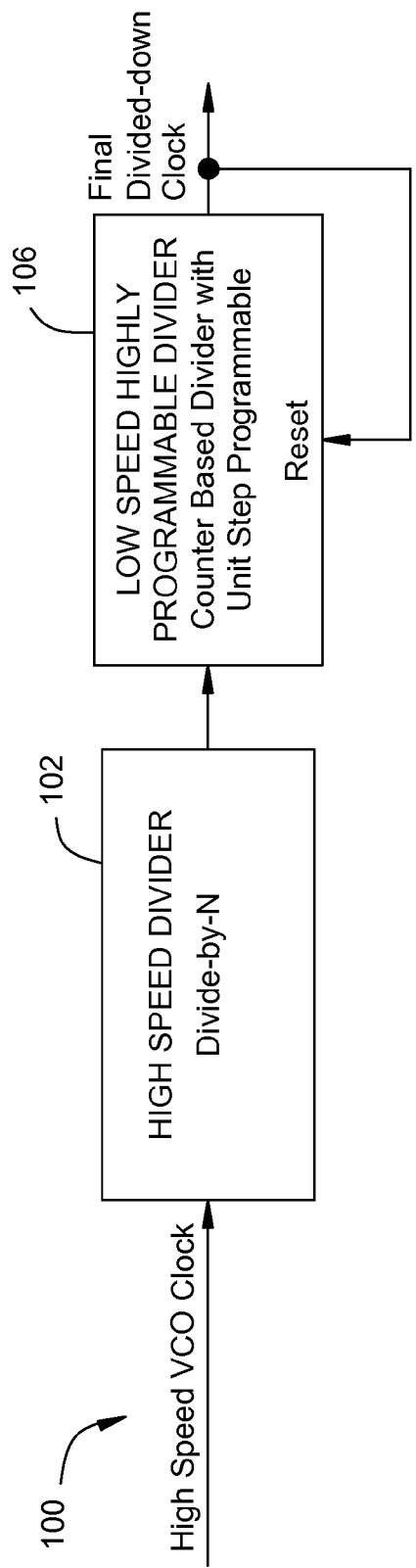
FIG. 1 is a schematic diagram illustrating a conventional divider.

Different step sizes in the formulas from NP to (N+1)P (or, conversely, from (N+1)P to NP) can generate much finer complementary coverage for the continuous division ratios than is possible using a conventional divider (such as that illustrated in FIG. 1). This kind of unit step programmability for high speed frequency dividers is useful in supporting multiple protocols and high speed applications by integrated circuits and field programmable gate arrays. Since the high speed design requirement is localized to the high speed divider 202 alone, and since the high speed divider 202 has only two modes of operation, the overall design of the divider 200 provides both high speed robustness and unit step divider ratio programmability.

FIG. 3 is a schematic diagram illustrating one embodiment of a divider 300. In particular, the divider 300 is a more detailed illustration of the divider 200 illustrated in FIG. 2. In the illustrated embodiment, the divider 300 is a double formula frequency divider. As illustrated, the divider 300 comprises a first stage 302 and a second stage 304, coupled by simple glue logic in the form of a plurality of multiplexers and logic gates. The glue logic provides slow programmable divider overflow detection and divider ratio formula control. Overflows in slow programmable dividers will trigger toggling between the two modes of operation (i.e., divide-by-N and divide-by-(N+1)) in the high speed divider, as discussed in greater detail below. Formula control sets the programmability step sized in N or N+1, thus forming two separate formulas for fine complementary coverage of continuous division between low and high divider ratios.

In one embodiment, the first stage 302 comprises a high-speed dual modulus divider, while the second stage 304 comprises two parallel low- to medium-speed dividers. A primary low speed divider functions as a second cascading stage, while a secondary low speed divider runs in parallel with the primary low speed divider but can be programmed to stop at any time before the primary low speed divider stops. The secondary low speed divider will generate a difference seed for the portion it is running for the final overall divider ratio (formula control allows this seed to be N or N+1). Thus, additional programmability is generated from the portion of the final overall divider ratio that is run by the secondary low speed divider, which can run in N or N+1 mode, as discussed in greater detail below.

The first stage 302 of the divider 300 comprises a prescaler 308. In one embodiment, the prescaler 308 is a (N+1)/N dual-modulus prescaler. The prescaler 308 is thus capable of dividing an incoming clock signal by either N or (N+1), as selected by a modulus control signal (MC). The second stage 304 controls the mode of the prescaler 308, as discussed in greater detail below. The prescaler 308 comprises an input that is coupled to the output of a clock (not shown). In one embodiment, the clock is a voltage-controlled oscillator whose output is indicated by the signal "vcoclk." The prescaler 308 also comprises an input for the modulus control signal that is coupled to an output of a first multiplexer 316. The first multiplexer 316 selects a formula for the final overall divider ratio, as discussed in further detail below.

The prescaler 308 further comprises an output that is coupled to an input of a second multiplexer 318. Another input of the second multiplexer 318 is coupled directly to the output of the clock. Yet another input of the second multiplexer 318 is coupled to a bypass control signal (bypassprescaler); when the bypass control signal goes HIGH (e.g., one), the output of the clock passes directly through the second multiplexer 318 (i.e., the output of the prescaler 308 is bypassed).

The second stage 304 of the divider 300 comprises a primary programmable counter 310, and a secondary programmable counter 312, and a flip flop 314. The primary programmable counter 310 and the secondary programmable counter 312 are not symmetric. The primary programmable counter 310 and the secondary programmable counter 312 start simultaneously, but the secondary programmable counter 312 stops before (or at least no later than) the primary programmable counter 310. The secondary programmable counter 312 runs in parallel with the primary programmable counter 310 to trigger different modulus modes in the prescaler 308. This provides additional programmability, since the whole counting region of the primary programmable counter 310 is split into divide-by-N mode and divide-by-(N+1) mode.

In one embodiment, the primary programmable counter 310 has a size of P, where P is the decimal value of the programmable binary control bus to the primary programmable counter 310. This indicates that the primary programmable counter 310 divides an incoming clock signal from the prescaler 308 by P+1 (i.e., can count up to the value of P-bit+1 clock rising edges from the divided down clock provided by the prescaler 308). In further embodiments, the primary programmable counter 310 can be any number of bits. The primary programmable counter 310 comprises an input that is coupled to an output of the second multiplexer 318. In addition, the primary programmable counter 310 comprises an output that is coupled to a reset (RST) input of the primary programmable counter 310, to a reset (RST) input of the secondary programmable counter 312, and to a clear (CLR) input of the flip flop 314. Thus, when the primary programmable counter 310 counts to its maximum value, it will sense an overflow and generate a pulse with a width of one clock cycle from the divided down clock (provided by the prescaler 308). This pulse serves as a reset signal to return the primary programmable counter 310, the secondary programmable counter 312, and the flip flop 114 to their initial (e.g., all counter elements are zero) states.

In one embodiment, the secondary programmable counter 312 has a size of S, where S is the decimal value of the programmable binary control bus to the secondary programmable counter 312. This indicates that the secondary programmable counter 312 divides an incoming clock signal from the prescaler 308 by S+1 (i.e., can count up to the value of S-bit+1 clock rising edges from the divided down clock provided by the prescaler 308, where $S \leq P$). The secondary programmable counter 312 need not necessarily be the same number of bits as the primary programmable counter 310. In some embodiments, the secondary programmable counter 312 can be any number of bits, as long as the decimal value of S is less than or equal to the decimal value of P. An input of the secondary programmable counter 312 is coupled to the output of an OR gate 320. One of the inputs of the OR gate 320 is, in turn, coupled to the output of the second multiplexer 318. Another input of the OR gate 320 is coupled to an output of the flip flop 314, as discussed in greater detail below.

As discussed above, a reset input of the secondary programmable counter 312 is coupled to the output of the primary programmable counter 310. The output of the secondary programmable counter 312 is coupled to an input of the flip flop 314.

In one embodiment, the flip flop 314 is an asynchronous-reset D-type flip flop. As discussed above, the clock (clk) input of the flip flop 314 is coupled to an output of the secondary programmable counter 312. As also discussed above, a reset input of the flip flop 314 is coupled to the output of the primary programmable counter 310. Complementary outputs of the flip flop 114 are coupled to the two inputs of the first multiplexer 316. In addition, a Q output of the flip flop 314 is coupled to an input of the OR gate 320, as discussed above.

The first multiplexer 316 comprises, as discussed above, two inputs that are coupled to the complementary outputs of the flip flop 314. Two additional inputs of the first multiplexer are coupled, respectively, to the formulaselect signal (discussed above) and to a bypassformulacontrol signal. If the bypassformulacontrol signal is enabled, the section of the divider 300 that controls formula selection (i.e., the secondary programmable counter 312, the flip flop 314, the first multiplexer 316, and the OR gate 320) is bypassed and powered down. This would reduce the divider 300 to a simple high speed divider (prescaler 308) cascaded with a single, low speed programmable divider (primary programmable counter 310) in which all divider ratios are multiples of N. The output of the first multiplexer 316 is, as discussed above, coupled to the modulus control input of the prescaler 308.

The divider 300 thus comprises a fast, dual-modulus divider (prescaler 308) cascading with slower, counter-based programmable dividers (primary programmable counter 310 and secondary programmable counter 312). Additional programmability is generated because the primary and secondary programmable counters 310 and 312 run in parallel, the shorter (secondary) programmable counter is used to trigger operation mode changes in the high speed prescaler 308, thus the upper stream high speed prescaler 308 has different seeds in the whole primary programmable counter's counting region. The programmability step sizes can be controlled to N or N+1, which generates double formulas. The two formulas together provide fine complementary coverage for continuous division between low and high divider ratios. When N, P, and S are properly selected, unit step incremental frequency divider ratio programmability can be generated without any speed or duty cycle performance degradation. This is not possible in conventional divider designs. The extra hardware and extra time budgeting in the high-speed design is negligible.

FIG. 4 is a schematic diagram illustrating the prescaler 308 of FIG. 3 in more detail. In particular, FIG. 4 illustrates one embodiment of the prescaler 308. As illustrated, the prescaler 308 comprises a first flip flop 400 and a second flip flop 402 coupled by an OR gate 404 and an AND gate 406. The OR gate 404 and the AND gate 406 collectively form a buffer.

An input of the first flip flop 400 is coupled to the clock, discussed above. Another input of the first flip flop 400 is coupled to an output of the second flip flop 402, as discussed in greater detail below. A reset (RST) input of the first flip flop 400 is coupled to a reset signal source (not shown). An output of the first flip flop 400 is coupled to an input of the AND gate 406.

Another input of the AND gate 406 is coupled to an output of the OR gate 404. An output of the AND gate 406 is coupled to an input of the second flip flop 402.

An input of the second flip flop 402 is coupled to the output of the AND gate 406, as discussed above. A reset (RST) input of the second flip flop 402 is coupled to the reset signal source. The complementary output (Q) of the second flip flop 402 is coupled to an input of the first flip flop 400. In addition, the complementary output (Q) of the second flip flop 402 is also coupled to an input of the OR gate 404.

Another input of the OR gate 404 is coupled to a modulus control (MC) signal that ultimately controls whether the prescaler 308 operates in divide-by-N or divide-by-(N+1) mode. In one embodiment, when the modulus control signal is low (e.g., zero), the prescaler 308 operates in divide-by-N mode. When the modulus control signal is high (e.g., one), the prescaler 308 operates in divide-by-(N+1) mode.

Figure 5:
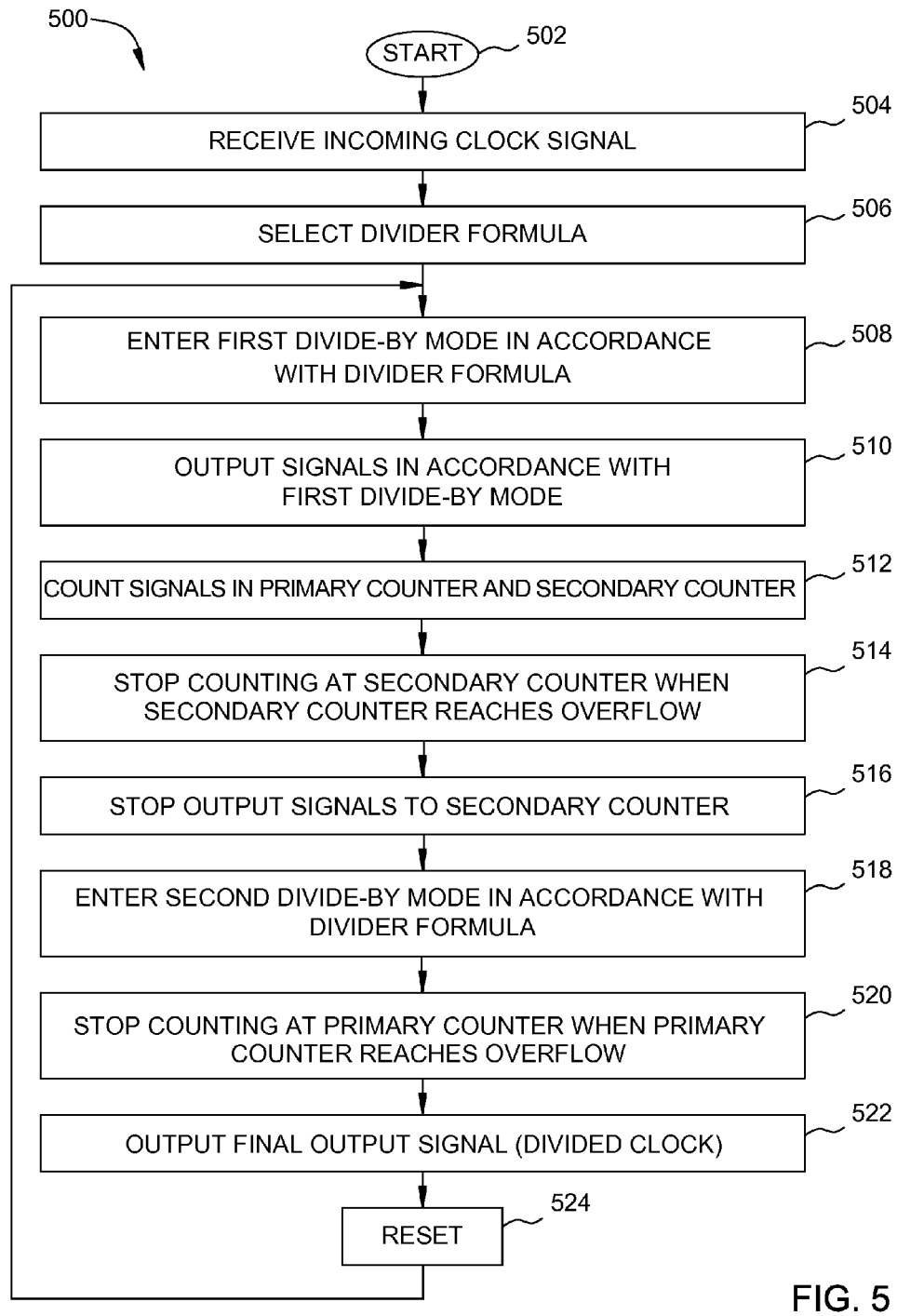
FIG. 5 is a flow diagram illustrating one embodiment of a method for dividing a clock frequency.

FIG. 5 is a flow diagram illustrating one embodiment of a method 500 for dividing a clock frequency. The method 500 may be implemented, for example, by the divider 300 illustrated in FIG. 3. As such, reference is made in the discussion of the method 500 to various components of FIG. 3. It will be appreciated, however, that application of the method 500 is not limited to the divider configuration illustrated in FIG. 3.

The method 500 is initialized in step 502. In one embodiment, the method 500 is initialized after either a reset of the divider 300 or a pulse of a divided clock. For example, the divider 300 may reset when the signal being output on the Q output of the flip flop 314 is LOW (e.g., zero).

In step 504, the incoming clock signal (vcoclk) is received on the input of the prescaler 308. References to "clock cycles" in the following discussion indicate cycles of this incoming clock signal.

In step 506, the first multiplexer 316 selects a divider formula. The divider formula is selected based on the output of the flip flop 314. In one embodiment, there are two potential divider formulas that can be selected. The first divider formula is $2N+(N+1)(P)-(S)$. The second divider formula is $2(N+1)+N(P)+(S)$. The first multiplexer 316 selects the divider formula in accordance with the formulaselect signal ("formsel") received over one of its inputs. In one embodiment, when the select signal is one, the first divider formula is selected. When the select signal is zero, the second divider formula is selected. In either case, the binary value of the secondary programmable counter 312 is less than or equal to the binary value of the primary programmable counter 310. For example, assuming that the select signal is zero, the second divider formula is selected. Further, for the sake of example, N is assumed to be equal to three (such that the prescaler is a 4/3 prescaler), S is assumed to be equal to three, and P is assumed to be equal to five.

In step 508, the prescaler 308 enters a first divide-by mode in accordance with the selected divider formula. The selected divider formula determines whether the first divide-by mode of the prescaler 308 (i.e., the mode by which the prescaler 308 will initially divide the incoming clock signal) will be N or (N+1). In one embodiment, if the first divider formula is selected, the first divide-by mode is divide-by-N mode. If the second divider formula is selected, the first divide-by mode is divide-by-(N+1) mode. For instance, continuing the example above, the prescaler 308 would enter divide-by four mode. At this time, the outputs of the primary programmable counter 310 and the secondary programmable counter 312 would be LOW (e.g., zero).

In step 510, the prescaler 308 outputs a signal (i.e., a rising edge) to the second multiplexer 318. Specifically, the prescaler 308 waits either N or (N+1) clock cycles, depending on the first divide-by mode (i.e., the prescaler 308 waits N clock cycles in divide-by-N mode and waits (N+1) clock cycles in divide-by-(N+1) mode). For instance, continuing the example above, the prescaler 308 would output the rising edge signal every four cycles of the vcoclk signal. The divided clock signal (divclk) remains at zero in this case. After the corresponding number of clock cycles have occurred, the prescaler 308 outputs the rising edge signal.

In step 512, the primary programmable counter 310 and the secondary programmable counter 312 start counting in response to every rising edge signal from the prescaler 308. In particular, the primary programmable counter 310 and the secondary programmable counter 312 count each rising edge signal received from the prescaler 308. For instance, continuing the example above, the primary programmable counter 310 and the secondary programmable counter 312 should count "one" every four cycles of the vcoclk signal.

In step 514, the secondary programmable counter 312 stops counting and outputs a HIGH (e.g., one) signal. Specifically, the secondary programmable counter 312 overflows after (S)(N or N+1) clock cycles (i.e., N when the first divide-by mode is divide-by-N mode and (N+1) when the first divide-by mode is divide-by-(N+1) mode) or after S HIGH signals from the prescaler 308. For instance, continuing the example above, the output of the secondary programmable counter 312 would change from LOW to HIGH after (3)(4) =12 clock cycles. Once the secondary programmable counter 312 overflows, it stops counting and outputs the HIGH signal.

In step 516, the flip flop 314 outputs HIGH, and OR gate 320 stops the clock to the secondary programmable counter 312. When the secondary programmable counter 312 stops, its output remains HIGH. In particular, the HIGH signal output by the secondary programmable counter 312 triggers a loading clock for the flip flop 314, which causes the Q output of the flip flop 314 to go HIGH. Continuing the example above, the Q output changes from LOW (e.g., zero) to HIGH (e.g., one). The Q output of the flip flop 314 controls the OR gate 320 that provides input to the secondary programmable counter 312.

In step 518, the prescaler 308 switches to a second divide-by mode. The second divide-by mode is whichever mode was not selected as the first divide-by mode. Thus, if the first divide-by mode was divide-by-(N+1) mode, then the second divide-by mode is divide-by-N mode. For instance, continuing the example above, the prescaler changes to divide-by-three mode, and now outputs a HIGH signal every three cycles of the vcoclk signal.

In step 520, the primary programmable counter 310 stops counting, and its output changes from LOW to HIGH (divclk). Specifically, after the secondary programmable counter 312 stops counting, the primary programmable counter 310 continues to count for another (P−S)(N or N+1) cycles (N when the second divide-by mode is divide-by-N mode and (N+1) when the second divide-by mode is divide-by-(N+1) mode). For instance, continuing the example above, the primary programmable counter 310 stops counting after (5-3)(3)=6 additional clock cycles.

In step 522, the primary programmable counter 310 outputs a final output signal (divclk). The final output signal comprises the vcoclk signal divided by an amount indicated by the selected divider formula (based on whether formsel=0 or 1, as discussed above). Thus, continuing the example above, the divclk signal divides the vcoclk signal by 2(3+1)+3(5)+(3)=26.

In step 524, the primary programmable counter 310, the secondary programmable counter 312, and the flip flop 314 reset. Specifically, the HIGH signal (divclk) from the primary programmable counter 310 causes the primary programmable counter 310, the secondary programmable counter 312, and the flip flop 314 to reset. For instance, continuing the example above, the Q output of the flip flop 314 once again goes LOW, and the output of the primary programmable counter 310 (divclk) remains HIGH for (N+1) clock cycles. This HIGH divclk signal functions as an internal reset for the primary programmable counter 310 and the secondary programmable counter 312, which causes the outputs of the primary programmable counter 310 and the secondary programmable counter 312 to go LOW.

The method 500 then returns to step 508, where the prescaler 308 re-enters the first divide-by mode. The method 500 then proceeds as discussed above.

As discussed above, the divider 300 is also capable of operating in a mode in which the formula control functionality is bypassed (i.e., in accordance with the bypassformulacontrol signal). Additionally, the divider 300 may operate in a mode in which the prescaler 308 is bypassed.

In prescaler bypass mode (triggered by receipt of a bypassprescaler signal by the second multiplexer 318), the prescaler 308 is bypassed. Only the primary programmable counter 310 performs frequency division in this case. Thus, the divider 300 is reduced to a simple counter-based frequency divider. This may be useful, for example, when it is known in advance that the input clock signal vcoclk is reduced to only extremely low speed operation. The prescaler bypass mode can then cover extremely low divider ratios, such as those omitted in FIG. 7 (e.g., divider ratios 1-7), since extremely low input clock frequencies usually require only extremely low divider ratios for low power operation.

In formula control bypass mode (triggered by receipt of a bypassformulacontrol signal by the first multiplexer 316), the section of the divider 300 that controls formula selection (i.e., the secondary programmable counter 312, the flip flop 314, the first multiplexer 316, and the OR gate 320) is bypassed and powered down. Thus, the divider 300 is reduced to a simple high speed divider (prescaler 308) cascaded with a single, low speed programmable divider (primary programmable counter 310) in which all divide ratios are multiples of N. This may be useful, for example, when only a simple divider ratio is required (e.g., divide-by-15, where the prescaler 308 is set to divide-by-3 and the primary programmable counter 310 is set to divide-by-5). The section of the divider 300 that controls formula selection is bypassed and powered down to save power.

If formula control bypass mode is selected, then the divider 300 uses the following divider ratio: F=NP, if formsel=1; and F=(N+1)P, if formsel=0. In this case, P is the value of the P-bits in the primary programmable counter 310.

Figure 6:
FIG. 6 is a timing diagram illustrating the timing of the various signals for the two divider formulas discussed.

FIG. 6 is a timing diagram illustrating the timing of the various signals for the two divider formulas discussed above. The timing diagram illustrates the timing of the various signals discussed above with respect to FIG. 5. In particular, the timing diagram for the formsel=0 case follows the example discussed with respect to FIG. 5, while the timing diagram for the formsel=1 case illustrates the opposite case (i.e., where the prescaler 308 would start in the divide-by-N mode).

By adjusting the values of the formsel signal, the primary programmable counter 310, and the secondary programmable counter 312, the divide ratio of the divider can be adjusted. In one embodiment, divide ratios from eight to 256 can be achieved through different permutations of the values of the formsel signal, the primary programmable counter 310, and the secondary programmable counter 312.

FIG. 7, for example is a look up table illustrating the divide ratios for different permutations of the values of the formsel signal, the primary programmable counter 310, and the secondary programmable counter 312. In particular, FIG. 7 illustrates the permutations that can achieve divide ratios from eight to twenty. Further permutations of these values can accomplish higher divide ratios.

Figure 8:
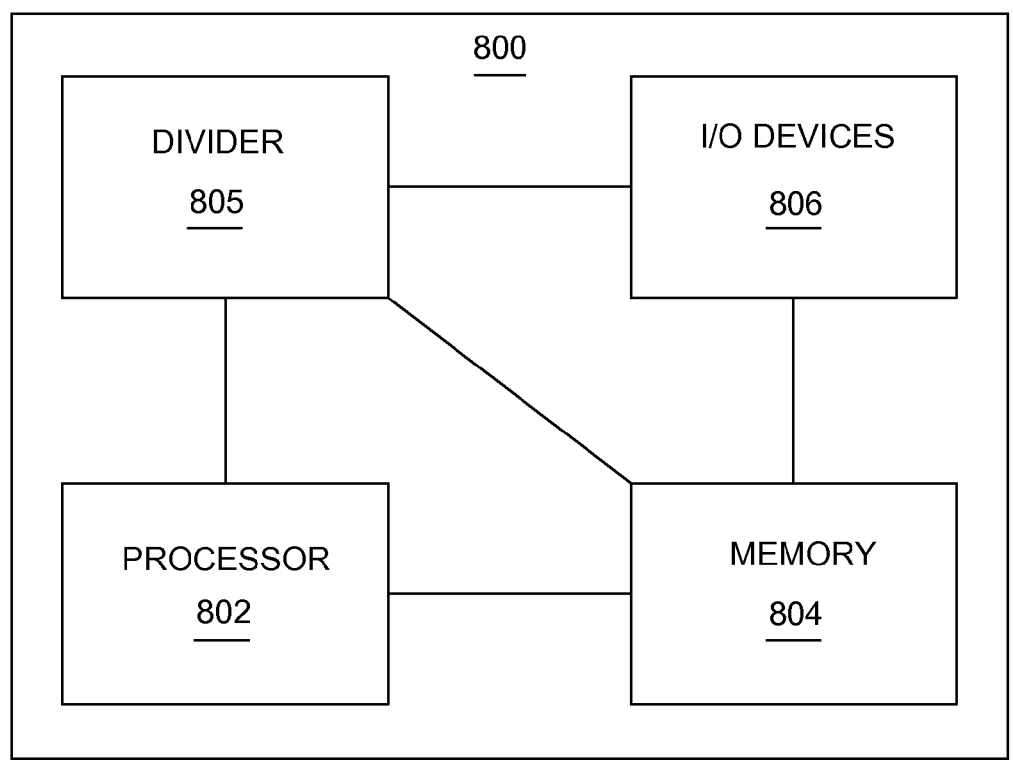
FIG. 8 is a high level block diagram of a general purpose computer or a computing device suitable for use in performing some or all of the functions described herein.

FIG. 8 is a high level block diagram of a general purpose computer or a computing device suitable for use in performing some or all of the functions described herein. The general purpose computer may incorporate, for example, in integrated circuit including a divider. As depicted in FIG. 8, the general purpose computer 800 comprises a processor element or processing elements 802 (e.g., a central processing unit (CPU)), a memory 804 (e.g., a random access memory (RAM) and/or a read only memory (ROM)), a divider module 805 for dividing clock frequencies received from a logic fabric of an integrated circuit, and various input/output devices 806 (e.g., storage devices, including but not limited to, a memory device, a tape drive, a floppy drive, a hard disk drive or a compact disk drive, a receiver, a transmitter, a speaker, a display, a speech synthesizer, an output port, and a user input device (such as a keyboard, a keypad, a mouse, and the like)).

The described embodiments can be implemented in a combination of software and hardware (e.g., using application specific integrated circuits (ASIC), a general purpose computer, one or more portions of a PLD, or any other hardware equivalents such as microprocessors). In one embodiment, one or more steps of the present module or process for dividing clock frequencies received from a logic fabric of an integrated circuit may be loaded into memory 804 and executed by processor 802 to implement the functions as discussed above. As such, the present module or process 805 for dividing clock frequencies of the described embodiments can be stored on a non-transitory computer readable storage medium (e.g., RAM memory, magnetic or optical drive or diskette and the like).

It should be noted that although not explicitly specified, one or more steps of the methods described herein may include a storing, displaying and/or outputting step as required for a particular application. In other words, any data, records, fields, and/or intermediate results discussed in the methods can be stored, displayed, and/or outputted to another device as required for a particular application. Furthermore, steps or blocks in the accompanying figures that recite a determining operation or involve a decision, do not necessarily require that both branches of the determining operation be practiced. In other words, one of the branches of the determining operation can be deemed as an optional step.

While the foregoing describes exemplary embodiments in accordance with one or more aspects of the present invention, other and further embodiments in accordance with the one or more aspects of the present invention may be devised without departing from the scope thereof, which is determined by the claims that follow and equivalents thereof. Claims listing steps do not imply any order of the steps. Trademarks are the property of their respective owners.

What is claimed is:

1. A circuit, comprising:
   a high-speed divider; and
   a plurality of programmable dividers cascading with the high-speed divider,
   wherein the plurality of programmable dividers is of a lower speed than the high-speed divider, and
   wherein the high-speed divider comprises:
     a first input coupled to a source of a clock signal;
     a second input coupled to a first multiplexer; and
     an output coupled to a second multiplexer.

2. The circuit of claim 1, wherein the plurality of programmable dividers controls a modulus of the high-speed divider.

3. The circuit of claim 1, wherein the high-speed divider comprises a dual-modulus prescaler.

4. The circuit of claim 1, wherein the plurality of programmable dividers comprises:
   a primary programmable counter; and
   a secondary programmable counter.

5. The circuit of claim 4, wherein the primary programmable counter divides an incoming signal by a first number that is larger than a second number by which the secondary programmable counter divides the incoming signal.

6. The circuit of claim 4, wherein the primary programmable counter comprises:
   a first input coupled to an output of the second multiplexer; and
   a first output coupled to a first input of the secondary programmable counter.

7. The circuit of claim 6, wherein the secondary programmable counter comprises:
   a first input coupled to an output of an OR gate.

8. The circuit of claim 7, wherein the OR gate comprises:
   a first input coupled to the output of the secondary multiplexer; and
   a second input coupled to a first output of a flip flop.

9. The circuit of claim 8, wherein the flip flop further comprises:
   a first input coupled to a first output of the primary programmable counter;
   a second input coupled to a first output of the secondary programmable counter;
   a first output coupled to a first input of the first multiplexer; and
   a second output coupled to a second input of the first multiplexer.

10. The circuit of claim 9, wherein the flip flop is an asynchronous-reset D-type flip flop.

11. A method of dividing a frequency of a clock signal, the method comprising:
    dividing the frequency in a high-speed divider in accordance with a first divide-by mode, wherein the dividing in accordance with the first divide-by mode results in a new signal being produced by the high speed divider every n cycles of the clock signal;
    counting a number of times that the new signal is received in a primary programmable divider;
    counting a number of times that the new signal is received in a secondary programmable divider; and
    dividing the frequency in the high-speed divider in accordance with a second divide-by mode when the secondary programmable divider overflows,
    wherein the dividing in accordance with the second divide-by mode results in the new signal being produced by the high speed divider every m cycles of the clock signal, and wherein m is a different number than n.

12. The method of claim 11, further comprising:
    stopping the counting in the secondary programmable divider when the dividing in accordance with the second divide-by mode is started; and
    continuing the counting in the primary programmable divider when the dividing in accordance with the second divide-by mode is started.

13. The method of claim 12, further comprising:
    outputting a divided frequency by the primary programmable divider when the primary programmable divider overflows.

14. The method of claim 12, wherein the primary programmable divider overflows a number of cycles of the clock after the secondary programmable divider overflows.

15. The method of claim 11, wherein n is greater than m.

16. The method of claim 11, wherein m is greater than n.

17. The method of claim 11, wherein the primary programmable divider and the secondary programmable divider operate at a slower speed than the high-speed divider.

18. A non-transitory computer-readable storage medium having stored thereon a plurality of instructions, the plurality of instructions including instructions which, when executed by a processor, cause the processor to perform steps of a method of dividing a frequency of a clock signal, comprising:
    dividing the frequency in a high-speed divider in accordance with a first divide-by mode, wherein the dividing in accordance with the first divide-by mode results in a new signal being produced by the high speed divider every n cycles of the clock signal;
    counting a number of times that the new signal is received in a primary programmable divider;
    counting a number of times that the new signal is received in a secondary programmable divider; and
    dividing the frequency in the high-speed divider in accordance with a second divide-by mode when the secondary programmable divider overflows, wherein the dividing in accordance with the second divide-by mode results in the new signal being produced by the high speed divider every m cycles of the clock signal, and wherein m is a different number than n.

* * * * *